United States Patent
Hirao et al.

(10) Patent No.: US 10,094,534 B2
(45) Date of Patent: Oct. 9, 2018

(54) SURFACE-EMITTING UNIT HAVING DIMMING REGIONS

(71) Applicant: KONICA MINOLTA, INC., Chiyoda-ku (JP)

(72) Inventors: Yusuke Hirao, Takatsuki (JP); Koujirou Sekine, Ibaraki (JP)

(73) Assignee: Konica Minolta, Inc., Tokyo (JP)

( * ) Notice: Subject to any disclaimer, the term of this patent is extended or adjusted under 35 U.S.C. 154(b) by 75 days.

(21) Appl. No.: 15/102,145

(22) PCT Filed: Nov. 6, 2014

(86) PCT No.: PCT/JP2014/079480
§ 371 (c)(1),
(2) Date: Jun. 6, 2016

(87) PCT Pub. No.: WO2015/083484
PCT Pub. Date: Jun. 11, 2015

(65) Prior Publication Data
US 2016/0327231 A1 Nov. 10, 2016

(30) Foreign Application Priority Data
Dec. 6, 2013 (JP) ................................ 2013-253297

(51) Int. Cl.
*H01L 51/52* (2006.01)
*H01L 27/32* (2006.01)
(Continued)

(52) U.S. Cl.
CPC .................. *F21V 3/02* (2013.01); *F21V 7/22* (2013.01); *G02B 6/00* (2013.01); *G02B 6/0051* (2013.01);
(Continued)

(58) Field of Classification Search
CPC .......... F21V 9/08; F21V 9/16; F21Y 2015/16; F21Y 2115/20; G02B 5/20; G02B 5/201;
(Continued)

(56) References Cited

U.S. PATENT DOCUMENTS 8,842,067 B2 * 9/2014 Cao ................... G02F 1/133615
345/102
2005/0141242 A1 6/2005 Takeuchi
(Continued)

FOREIGN PATENT DOCUMENTS

| JP | 2005-158369 | 6/2005 |
| JP | 2005-183352 | 7/2005 |

(Continued)

OTHER PUBLICATIONS

Machine translation of WO 2014083972, Espacenet operated by EPO, retrieved Sep. 30, 2017, http://translationportal.epo.org/emtp/translate/?ACTION=description-retrieval&COUNTRY=JP&ENGINE=google&FORMAT=docdb&KIND=A1&LOCALE=en_EP&NUMBER=WO2014083972&OPS=ops.epo.org/3.2&SRCLANG=ja&TRGLANG=en.*

*Primary Examiner* — Suezu Ellis
(74) *Attorney, Agent, or Firm* — Cozen O'Connor

(57) ABSTRACT

A surface-emitting unit includes a surface-emitting panel which emits light, a transmissive member which is arranged to face a light-emitting surface, propagates light emitted from the surface-emitting panel as being reflected therein, and allows light to exit from a light exit surface, and a scattering sheet which is provided to face a light exit surface of the transmissive member and scatters light. The transmissive member has a dimming surface provided between a light incident surface on which light emitted from the surface-emitting panel is incident and the light exit surface. The light-emitting surface has a light-emitting region which emits light and a non-light-emitting region which does not
(Continued)

emit light. The dimming surface is configured such that a region facing the non-light-emitting region is different in transmittance of light from a region facing the light-emitting region, in accordance with a distribution of light emitted from each of the surface-emitting panels.

5 Claims, 10 Drawing Sheets

(51) Int. Cl.
*F21V 8/00* (2006.01)
*F21V 3/02* (2006.01)
*G02B 6/00* (2006.01)
*G09F 13/04* (2006.01)
*F21V 7/22* (2018.01)
*F21Y 115/20* (2016.01)
*F21Y 105/16* (2016.01)
*F21Y 115/10* (2016.01)

(52) U.S. Cl.
CPC .......... *G09F 13/04* (2013.01); *H01L 27/3293* (2013.01); *H01L 51/5262* (2013.01); *H01L 51/5268* (2013.01); *F21Y 2105/16* (2016.08); *F21Y 2115/10* (2016.08); *F21Y 2115/20* (2016.08); *H01L 2251/5307* (2013.01); *H01L 2251/5315* (2013.01); *H01L 2251/5338* (2013.01)

(58) Field of Classification Search
CPC .......... G02B 5/205; G02B 5/206; G02B 5/22; G02B 5/223; H01L 27/3293; H01L 51/5262; H01L 51/5268
USPC ....... 362/600, 606, 607, 615, 617–619, 621, 362/622–625, 627
See application file for complete search history.

(56) References Cited

U.S. PATENT DOCUMENTS

| | | | |
|---|---|---|---|
| 2006/0215386 A1* | 9/2006 | Hatanaka | G02B 5/0242 362/97.1 |
| 2008/0158468 A1* | 7/2008 | Kim | G02F 1/13336 349/58 |
| 2014/0111974 A1* | 4/2014 | Choi | G09F 9/30 362/97.1 |
| 2016/0312964 A1* | 10/2016 | Hirao | G02B 6/00 |

FOREIGN PATENT DOCUMENTS

| | | | | |
|---|---|---|---|---|
| JP | 2005-353564 | 12/2005 | | |
| JP | 2009-211885 | 9/2009 | | |
| JP | 2010-164976 | 7/2010 | | |
| JP | 2011-238432 | 11/2011 | | |
| JP | 2013-8639 | 1/2013 | | |
| JP | WO 2014083972 A1 * | 6/2014 | ......... | H01L 51/5271 |

* cited by examiner

CHART OF LIGHT DISTRIBUTION IN VERTICAL PLANE

|  |  | FIRST CONFIGURATION EXAMPLE | SECOND CONFIGURATION EXAMPLE |
|---|---|---|---|
| TRANSPARENT ELECTRODE LAYER (ANODE) | THICKNESS (nm) | 150 | 150 |
| HOLE TRANSFER LAYER |  | 50 | 50 |
| LIGHT-EMITTING LAYER |  | 20 | 20 |
| ELECTRON TRANSFER LAYER |  | < 20 | 50 |
| EMISSION WAVELENGTH | PEAK VALUE (nm) | 685 | 550 |

LIGHT-EMITTING REGION | NON-LIGHT-EMITTING PORTION | LIGHT-EMITTING REGION

LIGHT-EMITTING REGION | NON-LIGHT-EMITTING PORTION | LIGHT-EMITTING REGION

LIGHT-EMITTING REGION | NON-LIGHT-EMITTING PORTION | LIGHT-EMITTING REGION

LIGHT-EMITTING REGION | NON-LIGHT-EMITTING PORTION | LIGHT-EMITTING REGION

LIGHT-EMITTING REGION · NON-LIGHT-EMITTING PORTION · LIGHT-EMITTING REGION

SURFACE-EMITTING UNIT HAVING DIMMING REGIONS

RELATED APPLICATIONS

This is a U.S. National Phase Application under 35 USC 371 of International Application PCT/JP2014/079480 filed on Nov. 06, 2014.

This application claims the priority of Japanese application no. 2013-253297 filed Dec. 6, 2013, the entire content of which is hereby incorporated by reference.

TECHNICAL FIELD

The present disclosure relates to a surface-emitting unit and particularly to a surface-emitting unit including a plurality of surface-emitting panels disposed such that light-emitting surfaces are two-dimensionally aligned.

BACKGROUND ART

A surface-emitting unit including a surface-emitting panel as a light source has recently attracted attention. The surface-emitting unit is not limited to a lighting apparatus but used also for a backlight for a liquid crystal display, a computer monitor, or an outdoor advertisement such as a digital signage. In general, a surface-emitting element such as an organic electroluminescence (EL) element is used for the surface-emitting panel. The organic EL element can obtain a high luminance with low power consumption, and exhibits excellent performance also in terms of responsiveness and lifetime.

Since it is necessary to seal a surface-emitting element and connect a line to a surface-emitting element in a surface-emitting panel, a non-light-emitting region is located around an outer edge of a light-emitting surface of the surface-emitting panel. In order to achieve a large area of a light source with a small number of panels, arrangement of surface-emitting panels without contact with each other is preferred. In that case, a gap is produced between surface-emitting panels and this gap is also a site not emitting light.

Therefore, in a surface-emitting unit including a plurality of surface-emitting panels, lowering in luminance in a front direction in a portion corresponding to a non-light-emitting portion and a periphery thereof is inevitable. Therefore, without any measures being taken, such lowering in luminance appears as variation in luminance and a dark portion may be produced along the non-light-emitting portion.

Japanese Laid-Open Patent Publication No. 2005-353564 (PTD 1) discloses the invention relating to a lighting apparatus. This lighting apparatus includes a surface-emitting device and an optical member. This publication states that recognition of a dark portion caused by a non-light-emitting portion is less likely according to this lighting apparatus.

Japanese Laid-Open Patent Publication No. 2005-158369 (PTD 2) discloses the invention relating to a lighting apparatus. This lighting apparatus includes an optical member and a plurality of light-emitting elements. This publication states that illumination light can be emitted with less variation in luminance over a wide area from a front surface of each light-emitting element by using the plurality of light-emitting elements with this optical member and the lighting apparatus.

CITATION LIST

Patent Document

PTD 1: Japanese Laid-Open Patent Publication No. 2005-353564

PTD 2: Japanese Laid-Open Patent Publication No. 2005-158369

SUMMARY OF INVENTION

Technical Problem

An object of the present disclosure is to provide a surface-emitting unit capable of achieving lessening of non-uniformity in luminance.

Solution to Problem

A surface-emitting unit according to one embodiment of the present disclosure includes a plurality of surface-emitting panels which are disposed such that light-emitting surfaces are two-dimensionally aligned and emit light toward a front, a transmissive member which is arranged to face the light-emitting surfaces of adjacent surface-emitting panels, propagates light emitted from the surface-emitting panels as being reflected in the transmissive member, and can allow light to exit from a light exit surface, and a scattering member which is provided to face the light exit surface of the transmissive member and scatters the light emitted from the plurality of surface-emitting panels.

The transmissive member has a dimming surface provided between a light incident surface on which light emitted from the surface-emitting panels is incident and the light exit surface. The light-emitting surface of each of the plurality of surface-emitting panels has a light-emitting region which emits light and a non-light-emitting region which is located around an outer periphery of the light-emitting region and does not emit light. The dimming surface is configured such that a region facing the non-light-emitting region is different in transmittance of light from a region facing the light-emitting region, in accordance with a distribution of light emitted from each of the plurality of surface-emitting panels.

DESCRIPTION OF EMBODIMENTS

Figure 1:
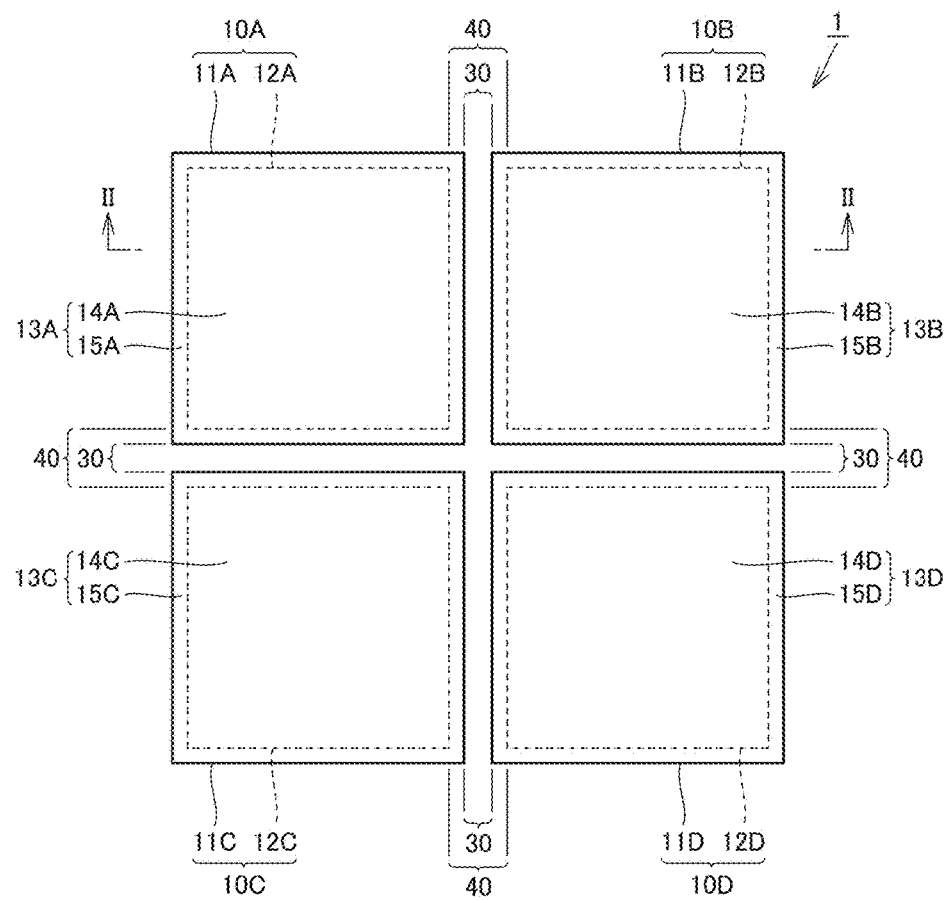
FIG. 1 is a plan view showing a surface-emitting unit according to a first embodiment.

Each embodiment and each example based on the present invention will be described hereinafter with reference to the drawings. When the number and an amount are mentioned in the description of each embodiment and each example, the scope of the present invention is not necessarily limited to the number and the amount unless otherwise specified. In the description of each embodiment and each example, the same and corresponding elements have the same reference numeral allotted and redundant description may not be repeated.

[First Embodiment]

Figure 2:
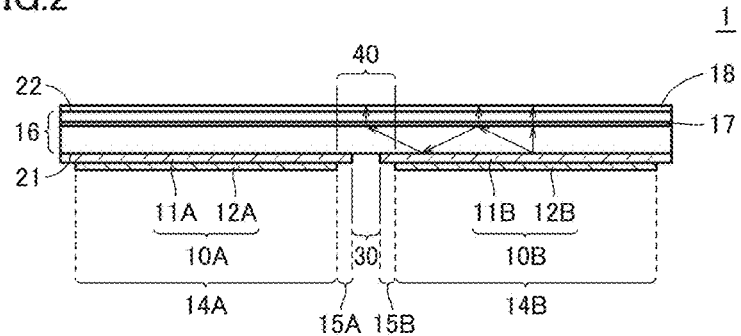
FIG. 2 is a schematic cross-sectional view of the surface-emitting unit shown in FIG. 1, along the line II-II shown in FIG. 1.
Figure 3:
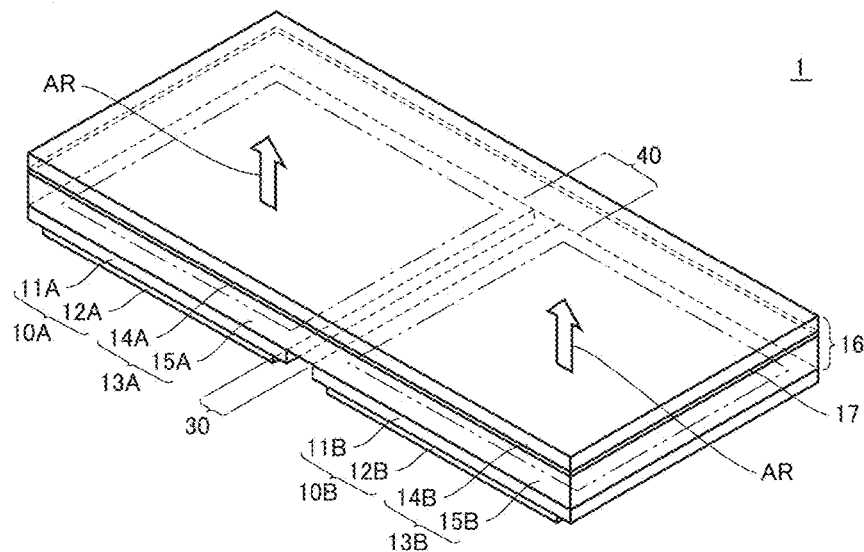
FIG. 3 is a perspective view showing a surface-emitting panel, a transmissive member, a dimming surface, and a scattering sheet included in the surface-emitting unit according to the first embodiment.

A surface-emitting unit 1 according to a first embodiment will be described with reference to FIGS. 1 to 9. FIG. 1 is a plan view showing surface-emitting unit 1 according to the first embodiment. FIG. 1 shows surface-emitting unit 1 from which a transmissive member 16 and a scattering sheet 18 which will be described later having been removed. FIG. 2 is a schematic cross-sectional view of the surface-emitting unit shown in FIG. 1 along the line II-II shown in FIG. 1. FIG. 3 is a perspective view showing surface-emitting panels 10A and 10B, transmissive member 16, a dimming surface 17 provided in transmissive member 16, and a scattering sheet 18 included in surface-emitting unit 1.

(Surface-Emitting Unit 1)

As shown in FIGS. 1 to 3, surface-emitting unit 1 generally has an outer shape substantially in a form of a flat parallelepiped. Surface-emitting unit 1 includes surface-emitting panels 10A to 10D, transmissive member 16, and scattering sheet 18.

Surface-emitting unit 1 may include a base plate and a frame plate (not shown) as a housing for accommodating surface-emitting panels 10A to 10D and transmissive member 16. The base plate is a member for forming a rear surface of the housing and holding surface-emitting panels 10A to 10D, and the frame plate is a member forming side surfaces of the housing and arranged along an outer periphery of surface-emitting unit 1. Scattering sheet 18 is a member forming a front surface of the housing.

(Surface-Emitting Panels 10A to 10D)

Each of surface-emitting panels 10A to 10D has a shape of a flat plate which extends along a surface direction. Surface-emitting panels 10A to 10D are disposed such that light-emitting surfaces 13A to 13D are two-dimensionally aligned. Surface-emitting panels 10A to 10D are formed of a stack of respective transparent substrates 11A to 11D and respective light-emitters 12A to 12D including organic EL elements, and transparent substrates 11A to 11D are located on a side of transmissive member 16. Surface-emitting panels 10A to 10D thus constructed are surface-emitting panels each constituted of organic EL elements of what is called a bottom emission type.

Surface-emitting panels 10A to 10D are not limited to those as above, and they may each be formed from a surface-emitting panel constituted of organic EL elements of a top emission type, a surface-emitting panel constituted of a plurality of light-emitting diodes and a diffusion plate arranged on an exit surface side (a front side) of each of the plurality of light-emitting diodes, or a surface-emitting panel including a cold cathode-ray tube.

Surface-emitting panels 10A to 10D are arranged in array. Surface-emitting panels 10A to 10D are arranged at a distance from one another and a gap 30 is provided between adjacent surface-emitting panels. Four gaps 30 in total are provided between adjacent surface-emitting panels of surface-emitting panels 10A to 10D.

By providing gap 30, a light source can be larger in area with a smaller number of panels than surface-emitting panels 10A to 10D arranged as being in contact with one another. When a light source does not have to be large in area in particular, surface-emitting panels 10A to 10D may be arranged as being in contact with one another without providing gap 30.

Surface-emitting panels 10A to 10D have light-emitting surfaces 13A to 13D, respectively. Light-emitting surfaces 13A to 13D are formed from respective outer surfaces of transparent substrates 11A to 11D located opposite to a side where light-emitters 12A to 12D are located. Light generated by light-emitters 12A to 12D passes through transparent substrates 11A to 11D and is emitted toward transmissive member 16 (toward the front) (see an arrow AR shown in FIG. 3) through light-emitting surfaces 13A to 13D.

As described above, surface-emitting panels 10A to 10D are disposed such that light-emitting surfaces 13A to 13D are two-dimensionally aligned. Surface-emitting panels 10A to 10D according to the present embodiment are disposed such that light-emitting surfaces 13A to 13D are flush with one another.

Light-emitting surfaces 13A to 13D have light-emitting regions 14A to 14D which emit light and non-light-emitting regions 15A to 15D which are located around outer peripheries of light-emitting regions 14A to 14D, respectively. Light-emitting regions 14A to 14D each have a rectangular shape. Non-light-emitting regions 15A to 15D are in a form of a rectangular frame. Non-light-emitting regions 15A to 15D are formed by providing a site for sealing of organic EL elements included in light-emitters 12A to 12D or connection of a line to an organic EL element.

In surface-emitting unit 1, a portion including gap 30 provided between adjacent surface-emitting panels and the non-light-emitting region of the surface-emitting panel located adjacently to gap 30 implements a non-light-emitting portion 40. Non-light-emitting portion 40 is a site which will cause a dark portion when no measures are taken, and four non-light-emitting portions in total are formed between adjacent surface-emitting panels. When no gap 30 is provided, a non-light-emitting region between adjacent surface-emitting panels corresponds to non-light-emitting portion 40. For example, a width of the non-light-emitting portion is set to be not smaller than 1/100 and not greater than 1/10 of a width of a light-emitting portion and the non-light-emitting portion.

Figure 4:
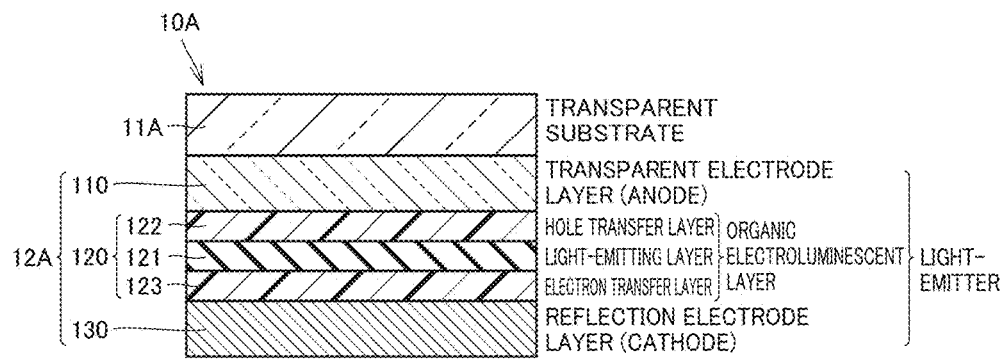
FIG. 4 is a cross-sectional view showing an organic EL element provided in the surface-emitting panel according to the first embodiment.

FIG. 4 is a cross-sectional view showing an organic EL element provided in surface-emitting panel 10A according to the first embodiment. FIG. 4 does not show transmissive member 16 provided on light-emitting surface 13A for the sake of convenience. A configuration of an organic EL element provided in surface-emitting panels 10A to 10D will be described with reference to FIG. 4. Since surface-emitting panels 10A to 10D are identical in configuration to one another, description will be given below with surface-emitting panel 10A being focused on.

An organic EL element provided in surface-emitting panel 10A includes, in addition to transparent substrate 11A, a transparent electrode layer 110, an organic electroluminescent layer 120, and a reflection electrode layer 130 as light-emitter 12A. Transparent electrode layer 110, organic electroluminescent layer 120, and reflection electrode layer 130 are stacked on a main surface of transparent substrate 11A in this order. Transparent electrode layer 110 corresponds to an anode and reflection electrode layer 130 corresponds to a cathode.

Transparent substrate 11A serves as a base material having a main surface (a surface opposite to light-emitting surface 13A), on which various layers described above are formed, and it is formed from an insulating member which satisfactorily allows passage of light in a visible light region. Transparent substrate 11A may be a rigid or flexible substrate. From a point of view of passage of light described above, for example, a glass plate, a plastic plate, a high-polymer film, a silicon plate, or a stack plate of the former implements transparent substrate 11A.

Transparent electrode layer 110 is provided on one main surface (the surface opposite to light-emitting surface 13A) of transparent substrate 11A, and formed from a film which allows satisfactory passage of light in the visible light region and has satisfactory electrical conductivity.

Specifically, transparent electrode layer 110 is formed, for example, from an inorganic conductive film such as an ITO (a mixture of an indium oxide and a tin oxide) film, an IZO (a mixture of an indium oxide and a zinc oxide film) film, a ZnO film, a CuI film, and an SnO2 film, an organic conductive film such as a PEDOT/PSS (a mixture of polyethylenedioxythiophene and polystyrenesulfonate) film, or a composite conductive film obtained by dispersing silver nanowires or carbon nanotubes in a high-polymer material.

Transparent electrode layer 110 is provided on transparent substrate 11A by adopting, for example, any of vapor deposition, spin coating, casting, ink-jet printing, and printing. In particular, spin coating, ink-jet printing, and printing can particularly suitably be made use of because an even film is likely to be obtained and generation of pinholes can be suppressed.

Organic electroluminescent layer 120 is provided on a main surface of transparent electrode layer 110 opposite to a side where transparent substrate 11A is located, includes a light-emitting layer 121 composed of at least a fluorescent compound or a phosphorescent compound, and is formed from a film which allows satisfactory passage of light in the visible light region. Organic electroluminescent layer 120 further has a hole transfer layer 122 located on a side of transparent electrode layer 110 relative to light-emitting layer 121 and an electron transfer layer 123 located on a side of reflection electrode layer 130 relative to light-emitting layer 121. A lithium fluoride film or an inorganic metal salt film may be formed at any position in organic electroluminescent layer 120 in a direction of thickness thereof.

For example, a stack film of an organic material represented, for example, by Alq3 (tris(8-hydroxyquinolinato) aluminum) or α-NPD (4,4'-bis[N-(1-naphtyl)-N-phenylamino]biphenyl) and a stack film including a film formed of such an organic material and a film of a metal represented by an MgAg alloy can suitably be made use of for organic electroluminescent layer 120.

An organic metal complex may be employed for a material for organic electroluminescent layer 120, from a point of view of improvement in external quantum efficiency or longer emission lifetime of an organic EL element. Here, as a metal element in accordance with formation of a complex, any one metal belonging to a group VIII, a group IX, and a group X in the periodic table, or Al or Zn is preferred and in particular, Ir, Pt, Al, or Zn is preferred.

Organic electroluminescent layer 120 is provided on transparent electrode layer 110 by adopting, for example, any of vapor deposition, spin coating, casting, ink-jet printing, and printing. In particular, spin coating, ink-jet printing, and printing can particularly suitably be made use of because an even film is likely to be obtained and generation of pinholes can be suppressed.

Reflection electrode layer 130 is provided on a main surface of organic electroluminescent layer 120 opposite to the side where transparent electrode layer 110 is located, and formed from a film which satisfactorily reflects light in the visible light region and has satisfactory electrical conductivity. Specifically, reflection electrode layer 130 is formed from a metal film composed, for example, of Al, Ag, Ni, Ti, Na, or Ca, or an alloy containing any of them. Reflection electrode layer 130 is provided on organic electroluminescent layer 120, for example, by adopting vapor deposition or sputtering.

(Transmissive Member 16)

Referring again to FIGS. 2 and 3, transmissive member 16 is arranged to face light-emitting surfaces 13A to 13D of respective surface-emitting panels 10A to 10D and located on the front side when viewed from transparent substrates 11A to 11D. Transmissive member 16 according to the present embodiment is provided on surface-emitting panels 10A to 10D across gap 30. Transmissive member 16 is fixed to transparent substrates 11A to 11D (light-emitting surfaces 13A to 13D) with an optically transparent adhesive (not shown).

A material which is high in transmittance (of which total luminous transmittance in a range of wavelengths of visible light measured with a method in conformity with JIS K 7361-1: 1997 is, for example, not lower than 80%) and is excellent in flexibility is preferably used for transmissive member 16. A substrate made of a resin having transparency such as an acrylic resin or a film of a transparent resin such as polyethylene terephthalate (PET) is exemplified as transmissive member 16.

In the present embodiment, transmissive member 16 and transparent substrates 11A to 11D are formed as members separate from one another. Light-emitters 12A to 12D function as light-emitting portions, and transmissive member 16 and transparent substrates 11A to 11D function as light guide portions which guide light generated by light-emitters 12A to 12D.

Transmissive member 16 has dimming surface 17 provided between a light incident surface 21 on which light emitted from surface-emitting panels 10A to 10D is incident and a light exit surface 22 where light exits from transmissive member 16 to the outside. Dimming surface 17 is formed by printing by ink-jet printing on transmissive member 16, a pattern having annular dimming regions which decrease a quantity of light which will pass through dimming surface 17. More specifically, transmissive member 16 as shown in FIGS. 2 and 3 can be obtained by forming dimming surface 17 by printing the pattern on the transmissive member with ink-jet printing and layering another transmissive member on the transmissive member having dimming surface 17 formed.

Dimming surface 17 may also be formed by bringing an optical filter provided with a pattern including a plurality of annular dimming regions (hereinafter also referred to as a "dimming pattern") into optically intimate contact with the transmissive member, with the use of an optically transparent adhesive. This pattern adjusts a transmittance at dimming surface 17.

Figure 5:
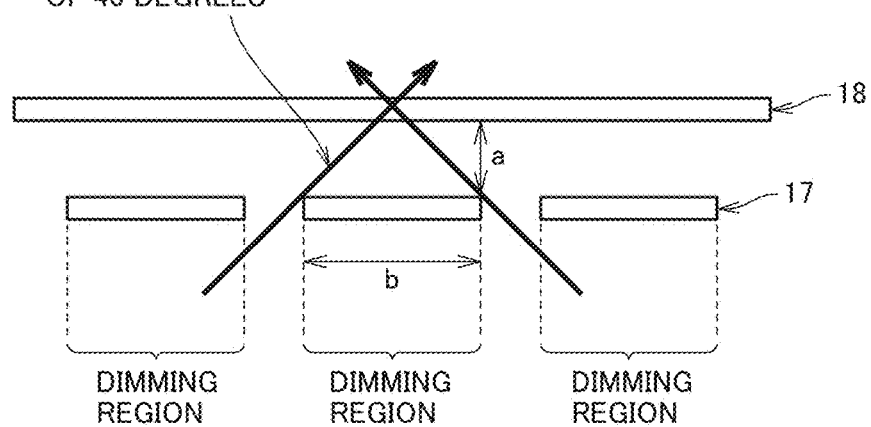
FIG. 5 is a conceptual diagram for illustrating a method of forming a dimming pattern according to the first embodiment.
Figure 6:
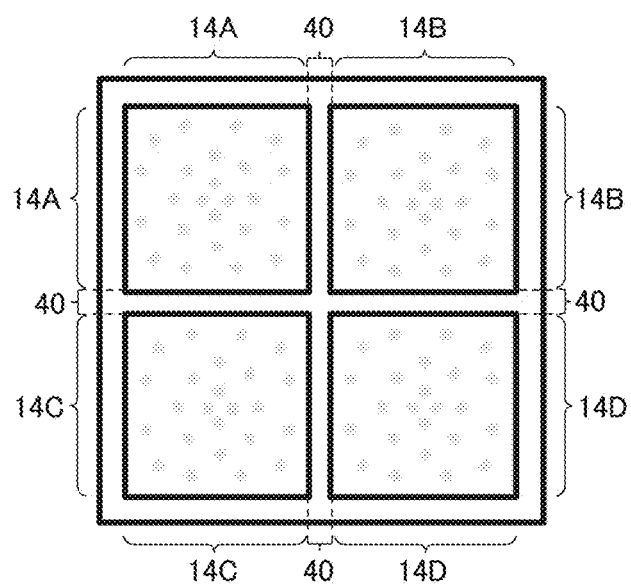
FIG. 6 is a conceptual diagram showing visual recognizability of the dimming pattern when the dimming pattern is formed with the method shown in FIG. 5.
Figure 7:
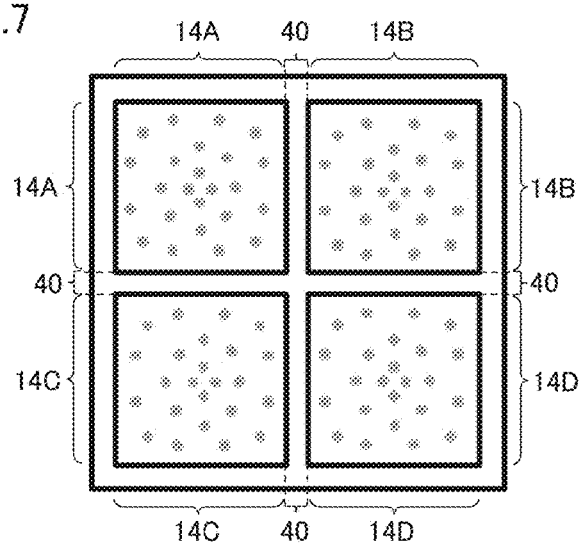
FIG. 7 is a conceptual diagram showing visual recognizability of the dimming pattern when the dimming pattern is not formed with the method shown in FIG. 5.

A method of forming a dimming pattern in light-emitting surface 17 and visual recognizability of the dimming pattern in connection with the method will be described with reference to FIGS. 5 to 7. FIG. 5 is a conceptual diagram for illustrating a method of forming a dimming pattern according to the first embodiment. FIG. 6 is a conceptual diagram showing visual recognizability of the dimming pattern when the dimming pattern is formed with the method shown in FIG. 5. FIG. 7 is a conceptual diagram showing visual recognizability of the dimming pattern when the dimming pattern is not formed with the method shown in FIG. 5.

Figure 8:
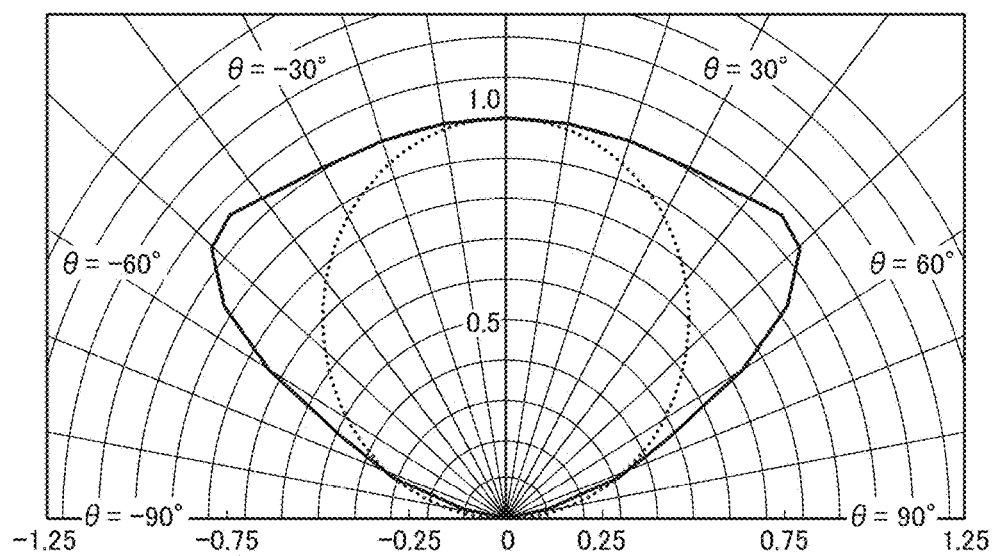
FIG. 8 is a diagram showing light distributions in a vertical plane according to a first configuration example and a second configuration example of the organic EL element provided in the surface-emitting panel shown in FIG. 1.

When light having a Lambertian distribution which is a light distribution in a vertical plane of a normal organic EL element is emitted from a surface-emitting panel, a luminance of light in a range of approximately $-45°<\theta<45°$ is relatively as high as approximately 70% of a luminance of light emitted toward the front) ($\theta=0°$), with $\theta$ representing an angle formed with respect to a reference axis (also called an optical axis herein) extending in a direction of normal to a light-emitting surface in a plane perpendicular to the light-emitting surface of light emitted from the surface-emitting panel (see a first configuration example in FIG. 8 which will be described later).

Therefore, a dimming region lower in transmittance than a region where no dimming region is formed (a non-dimming region) is preferably formed in dimming surface 17 such that its radius b/2 is not greater than a width a from dimming surface 17 to light exit surface 22. By thus forming the dimming region, intense light tends to exit also from light exit surface 22 facing the dimming region, and hence it becomes more difficult to recognize the dimming pattern from the front.

Referring to FIG. 6, when the dimming pattern is formed such that radius b/2 of the dimming region is not greater than width a from dimming surface 17 to light exit surface 22, the dimming pattern is pale and it is difficult to recognize the dimming pattern in each of light-emitting regions 14A to 14D. FIG. 7 shows that the dimming pattern is not formed such that radius b/2 of the dimming region is not greater than width a from dimming surface 17 to light exit surface 22, and it can be seen that the dimming pattern is relatively easily recognized in each of light-emitting regions 14A to 14D in this case.

Referring again to FIG. 2, dimming surface 17 is located such that a thickness from light incident surface 21 to dimming surface 17 is greater than a thickness from dimming surface 17 to light exit surface 22. With such a construction, the number of times of reflection until light propagates in transmissive member 16 on a side of light incident surface 21 relative to dimming surface 17 and reaches dimming surface 17 facing non-light-emitting portion 40 decreases and a quantity of light dimmed by reflection until the light reaches dimming surface 17 becomes small. Consequently, since a luminance in non-light-emitting portion 40 is improved with increase in quantity of light which exits from light exit surface 22 facing non-light-emitting portion 40, a transmittance can readily be adjusted with the dimming pattern in dimming surface 17.

Since flexibility is lower with increase in thickness from light incident surface 21 to dimming surface 17, the thickness is desirably increased within a range satisfying desired flexibility.

Light generated by light-emitters 12A to 12D passes through transparent substrates 11A to 11D, is emitted from light-emitting surfaces 13A to 13D, and thereafter enters light incident surface 21 of transmissive member 16. The light which enters the light incident surface passes through transmissive member 16 on the side of light incident surface 21 and exits toward scattering sheet 18 through dimming surface 17 and light exit surface 22, or the light exits toward scattering sheet 18 as being reflected and propagated in transmissive member 16 on the side of light incident surface 21 through dimming surface 17 and light exit surface 22.

Scattering sheet 18 allows passage of light emitted from surface-emitting panels 10A to 10D as being scattered (diffused) to the outside, and is provided to face light exit surface 22 of transmissive member 16. A scattering sheet which scatters light by making use of an internal scattering function with fine particles being contained or a scattering sheet which scatters light by making use of an interfacial reflection function with surface irregularities is available as scattering sheet 18.

(Light Distribution in Vertical Plane)

Figures 9, 10:
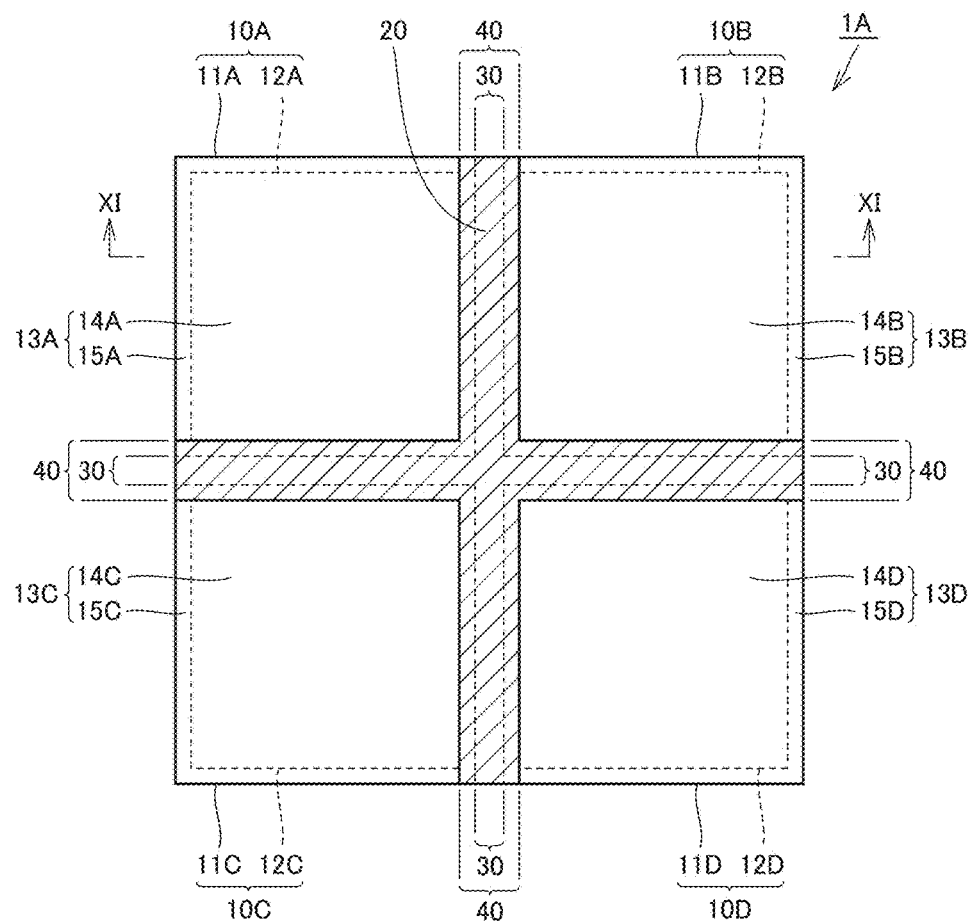
FIG. 9 is a chart showing exemplary conditions for specific film configurations implementing the organic EL elements according to the first configuration example and the second configuration example.
FIG. 10 is a plan view showing a surface-emitting unit 1A in a second embodiment.

FIG. 8 is a diagram showing light distributions in a vertical plane according to a first configuration example and a second configuration example of the organic EL element provided in the surface-emitting panel shown in FIG. 1. FIG. 9 is a chart showing exemplary conditions for specific film configurations implementing the organic EL elements according to the first configuration example and the second configuration example. The first configuration example and the second configuration example of the organic EL element provided in the surface-emitting panel of the surface-emitting unit according to the present embodiment will be described in detail with reference to FIGS. 8 and 9.

As shown in FIG. 8, when a light distribution curve in a plane perpendicular to a light-emitting surface of light emitted from a surface-emitting panel is drawn for the organic EL element according to the first configuration example, the light distribution curve satisfies a condition of $L=\cos\theta=1$, with a luminance on the front side along an optical axis extending in a direction of normal to the light-emitting surface (that is, a luminance at $\theta=0°$ shown in the figure) being defined as 1 and L representing a luminance in a direction in which an angle formed with respect to the optical axis in the plane is $\theta$ (that is, a luminance in a range of $-90°<\theta<90°$ where $\theta\neq0°$). Namely, the organic EL element according to the first configuration example has a Lambertian distribution which is a light distribution in the vertical plane of an organic EL element included in a normal light source.

In connection with the organic EL element according to the second configuration example, the light distribution curve includes a portion satisfying a condition of L>cos θ. Specifically, the organic EL element according to the second configuration example satisfies the condition of L>cos θ substantially in a range of −70°≤θ≤70° (where θ≠0°).

Here, the organic EL element according to the present configuration example having the light distribution in the vertical plane described above can be realized, for example, by adjusting a thickness of the electron transfer layer as shown in FIG. 9.

The Lambertian distribution in the first configuration example is substantially obtained by employing an ITO film for the transparent electrode layer, employing an MgAg film for the electron transfer layer, employing an Alq3 film for the light-emitting layer, employing an α-NPD film for the hole transfer layer, employing an Ag film for the reflection electrode layer, and setting a thickness of the electron transfer layer to 20 nm or smaller when thicknesses of the transparent electrode layer/the hole transfer layer/the light-emitting layer are set to 150 nm/50 nm/20 nm, respectively, as shown in FIG. 9. By setting a thickness of the electron transfer layer to 50 nm, the light distribution in the vertical plane in the second configuration example is obtained.

FIG. 9 also shows for the reference purpose, a peak value of a wavelength of light emitted from the organic EL element when such a film configuration is adopted.

The light distribution in the vertical plane of the organic EL element according to the second configuration example means that angular dependency of light which exits from the light-emitting surface is different from the Lambertian distribution of the organic EL element according to the first configuration example, and particularly means that a quantity of light which exits in an oblique direction on the front side is greater than a quantity of light which exits toward the front.

Therefore, when the surface-emitting panel provided with the organic EL element having such a light distribution in the vertical plane as in the second configuration example is employed, a quantity of light totally reflected and propagated in transmissive member 16 is greater than in a surface-emitting panel provided with an organic EL element having the Lambertian distribution as in the first configuration example, and hence a quantity of light which exits from light exit surface 22 facing non-light-emitting portion 40 also increases. Namely, the surface-emitting panel according to the second configuration example achieves an improved luminance in the front direction in a portion corresponding to the non-light-emitting portion and a periphery thereof, as compared with the surface-emitting panel according to the first configuration example.

Thus, a front luminance distribution of a surface-emitting unit is different depending on a light distribution in the vertical plane of an organic EL element. Therefore, a more uniform front luminance distribution can be realized by appropriately adjusting a distribution of transmittance of light of the region of the dimming surface which faces the non-light-emitting region and a distribution of transmittance of light of the region which faces the light-emitting region, in accordance with the light distribution.

Namely, dimming surface 17 is configured such that the region facing the non-light-emitting region is different in distribution of transmittance of light from the region facing the light-emitting region, in accordance with a distribution of light emitted from each of the surface-emitting panels. Since surface-emitting unit 1 according to the present embodiment can guide more light to light exit surface 22 in a portion facing the non-light-emitting portion and a periphery thereof by propagating light emitted from the organic EL element through transmissive member 16, a luminance in the front direction of the portion corresponding to the non-light-emitting portion and the periphery thereof can be improved.

Since surface-emitting unit 1 can adjust with dimming surface 17 formed on transmissive member 16, in its surface, a transmittance of light which exits toward the front, a surface-emitting unit in which non-uniformity in luminance is lessened and the non-light-emitting portion is more inconspicuous can be obtained by appropriately adjusting a distribution of transmittance of the portion of dimming surface 17 facing the non-light-emitting region and the light-emitting region in accordance with a distribution of light emitted from each of the plurality of surface-emitting panels.

In addition, a surface-emitting unit in which color unevenness has also been lessened can also be obtained by setting a color of light emitted from surface-emitting panels 10A to 10D, a color of the dimming region, and a color of scattering sheet 18 (a color of a scattering pattern formed on scattering sheet 18) to be the same. For example, a color of a light source of surface-emitting panels 10A to 10D, a color of the dimming region, and a color of the scattering pattern are unified to white. Since surface-emitting unit 1 is generally integrally formed of a flexible material by employing a flexible material for surface-emitting panel 10 (transparent substrate 11) and transmissive member 16, a flexible, uniform surface-emitting unit can also be obtained.

[Second Embodiment]

Figure 11:
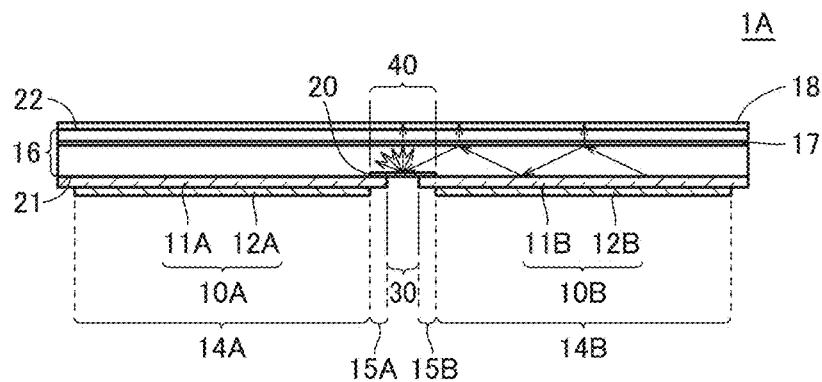
FIG. 11 is a schematic cross-sectional view of the surface-emitting unit shown in FIG. 10, along the line XI-XI shown in FIG. 10.

A surface-emitting unit 1A according to a second embodiment will be described with reference to FIG. 10. FIG. 10 is a plan view showing surface-emitting unit 1A according to the second embodiment. FIG. 11 is a schematic cross-sectional view of the surface-emitting unit shown in FIG. 10, along the line XI-XI shown in FIG. 10. A difference between surface-emitting unit 1A and surface-emitting unit 1 (see FIGS. 1 and 2) will be described here. The configuration of surface-emitting unit 1A corresponds to the configuration of surface-emitting unit 1 to which a reflection member 20 is added and it is otherwise the same as the configuration of surface-emitting unit 1.

(Reflection Member 20)

Reflection member 20 has a function as a light scattering portion, and scatters and reflects some of light emitted from light-emitting surfaces 13A to 13D of respective surface-emitting panels 10A to 10D and propagated in transmissive member 16. Reflection member 20 is formed from a cross-shaped member (see FIG. 10) having four sites in total in correspondence with four non-light-emitting portions 40 (see FIG. 10), each of which extends in a form of a rod from a central portion of surface-emitting unit 1A. A reflection member which scatters and reflects light without allowing passage thereof is preferred as reflection member 20.

Each of the sites of reflection member 20 which extends in a form of a rod is arranged along outer edges of light-emitting surfaces of adjacent surface-emitting panels so as to overlap with a non-light-emitting region when viewed from the front (the light-emitting surface). More specifically, reflection member 20 is provided on light-emitting surfaces of surface-emitting panels so as to lie across outer edges of the light-emitting surfaces of the adjacent surface-emitting panels and to extend along the outer edges.

Reflection member 20 will be described in further detail with reference to FIG. 11. Since the four sites of reflection member 20 which extend in a form of a rod are identical in shape to one another, description will be given below with attention being paid only to a portion of surface-emitting panels 10A to 10D described above between surface-emitting panel 10A and surface-emitting panel 10B.

As shown in FIG. 11, reflection member 20 is located on light-emitting surface 13A of first surface-emitting panel 10A and light-emitting surface 13B of second surface-emitting panel 10B so as to face non-light-emitting portion 40.

More specifically, reflection member 20 lies across non-light-emitting region 15A located along the outer edge of light-emitting surface 13A of first surface-emitting panel 10A on a side of second surface-emitting panel 10B and non-light-emitting region 15B located along the outer edge of light-emitting surface 13B of second surface-emitting panel 10B on a side of first surface-emitting panel 10A. Namely, reflection member 20 overlaps with non-light-emitting regions 15A and 15B of such portions when viewed from the front). Furthermore, reflection member 20 is provided on first surface-emitting panel 10A and second surface-emitting panel 10B so as to extend along non-light-emitting regions 15A and 15B.

A method of providing a scattering function of reflection member 20 includes a method of roughening of a surface of transmissive member 16 in advance, a method of roughening a surface of reflection member 20, and a method of providing on a smooth reflective metal film, a scattering layer in which particles for scattering have been mixed in a resin binder. Reflection member 20 may be formed from a white ink based on an organic solvent in which scattering particles have been dispersed. In this case, a scattering and reflecting surface of reflection member 20 can be formed, for example, by applying a white ink with ink-jet printing to the surface of transmissive member 16.

Light generated by light-emitters 12A and 12B passes through transparent substrates 11A to 11D, is emitted from light-emitting surfaces 13A to 13D, and thereafter enters light incident surface 21 of transmissive member 16. The light which enters the light incident surface passes through transmissive member 16 on the side of light incident surface 21, further passes through dimming surface 17 and light exit surface 22, and exits toward scattering sheet 18. Alternatively, the light which enters the light incident surface exits toward scattering sheet 18 as being reflected and propagated in transmissive member 16 on the side of light incident surface 21 through dimming surface 17 and light exit surface 22.

Here, since reflection member 20 is provided in surface-emitting unit 1A according to the second embodiment, light which reaches reflection member 20 as being reflected and propagated in transmissive member 16 on the side of light incident surface 21 is scattered and reflected toward the front by reflection member 20. Namely, with this scattering and reflection effect, more light of light emitted from the organic EL element can be guided to light exit surface 22 of the portion corresponding to the non-light-emitting portion and the periphery thereof than in surface-emitting unit 1 according to the first embodiment. Consequently, the front luminance of that portion is improved.

Thus, in surface-emitting unit 1A according to the second embodiment, an area in which a luminance should be adjusted with the use of dimming surface 17 for making a front luminance distribution uniform is narrowed. Therefore, adjustment of a luminance with dimming surface 17 is easier in surface-emitting unit 1A according to the second embodiment than in surface-emitting unit 1 according to the first embodiment. In surface-emitting unit 1A, a distribution of transmittance at dimming surface 17 can be smoother because an area in which a luminance is adjusted is narrower than in surface-emitting unit 1, and hence a distribution of dimming patterns can be smoother. Consequently, it can be more difficult to recognize the dimming pattern in surface-emitting unit 1A.

In surface-emitting unit 1A according to the second embodiment, scattering sheet 18 may be bonded to transmissive member 16 with air being interposed between the scattering sheet and light exit surface 22 of transmissive member 16. With such a construction, a boundary between the light-emitting region and a region where a scattering and reflecting surface facing the non-light-emitting portion is formed can be more inconspicuous when surface-emitting panel 10 is visually recognized from the front. Consequently, a surface-emitting unit achieving further lessening of non-uniformity in luminance can be realized.

As set forth above, surface-emitting unit 1A according to the second embodiment propagates light emitted from an organic EL element through transmissive member 16 and scatters and reflects the propagated light with reflection member 20. Consequently, more light can be guided to light exit surface 22 of a portion facing the non-light-emitting portion and a periphery thereof. Therefore, surface-emitting unit 1A can achieve a further improved luminance in the front direction of the portion corresponding to the non-light-emitting portion and the periphery thereof.

Surface-emitting unit 1A can adjust with dimming surface 17 formed on transmissive member 16, in its surface, a transmittance of light which exits toward the front. Thus, a distribution of transmittance of a portion of dimming surface 17 facing the non-light-emitting region and the light-emitting region can appropriately be adjusted in accordance with a distribution of light emitted from each of the plurality of surface-emitting panels. Consequently, a surface-emitting unit in which non-uniformity in luminance is lessened and a non-light-emitting portion is more inconspicuous can be obtained.

In addition, a surface-emitting unit in which color unevenness has also been lessened can be obtained by setting a color of light emitted from the surface-emitting panels, a color of the dimming region, and a color of scattering sheet 18 to be the same. A flexible surface-emitting unit can also be obtained by employing a flexible material for a surface-emitting panel and a transmissive member.

EXAMPLES

Results of simulation of a front luminance profile of surface-emitting units according to Examples 1 to 4 based on the second embodiment described above and a front luminance profile of a surface-emitting unit according to Example 5 based on the first embodiment will be described below. For comparison, results of simulation of a front luminance profile of a surface-emitting unit according to a Comparative Example not based on the embodiments described above will also be shown.

Figure 12:
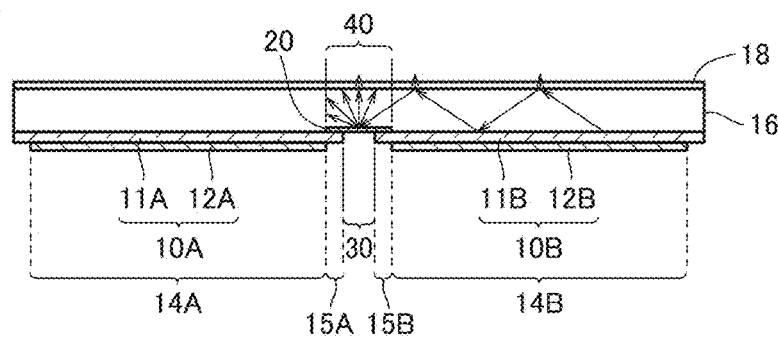
FIG. 12 is a cross-sectional view of a surface-emitting unit according to a Comparative Example.

FIG. 12 is a cross-sectional view of a surface-emitting unit according to a Comparative Example. The surface-emitting unit according to Comparative Example is different in configuration from surface-emitting unit 1A according to the second embodiment in that no dimming surface is formed in the transmissive member, and it is otherwise the same in configuration. Namely, the surface-emitting unit according to Comparative Example does not have a luminance adjustment function (a transmittance adjustment function) achieved by the dimming surface in its surface. Surface-emitting units according to Comparative Examples 1 and 2 include the surface-emitting panels provided with the organic EL elements according to the first configuration example and the second configuration example shown in FIG. 9, respectively.

The surface-emitting units according to Examples 1 and 2 based on the second embodiment each include the surface-emitting panel provided with the organic EL element according to the first configuration example shown in FIG. 9. In the surface-emitting unit according to Example 1, a dimming pattern shown in FIG. 14 which will be described later is formed in the dimming surface described above, and in the surface-emitting unit according to Example 2, a dimming pattern shown in FIG. 15 which will be described later is formed in the dimming surface.

The surface-emitting units according to Examples 3 and 4 based on the second embodiment each include the surface-emitting panel provided with the organic EL element according to the second configuration example shown in FIG. 9. In the surface-emitting unit according to Example 3, a dimming pattern shown in FIG. 16 which will be described later is formed in the dimming surface described above, and in the surface-emitting unit according to Example 4, a dimming pattern shown in FIG. 17 which will be described later is formed in the dimming surface.

The surface-emitting unit according to Example 5 based on the first embodiment includes the surface-emitting panel provided with the organic EL element according to the second configuration example shown in FIG. 9. In the surface-emitting unit according to Example 5, a dimming pattern shown in FIG. 18 which will be described later is formed in the dimming surface described above.

In each of the surface-emitting units according to Examples 1 to 5 and Comparative Examples 1 to 2, the surface-emitting panel has a width of 90 mm, the non-light-emitting portion (the non-light-emitting region and the gap) has a width of 10 mm, and a scattering sheet having a transmittance of approximately 80% and Haze of 90% or higher is employed as the scattering sheet. In the surface-emitting units according to Examples 1 to 4 and Comparative Examples 1 to 2, a white reflection film is used for the reflection member.

The surface-emitting units according to Comparative Examples 1 to 2 each have an acrylic plate as the transmissive member (having an index of refraction of 1.5) which has a thickness of 5.5 mm. In the surface-emitting units according to Examples 1 to 5, the acrylic plate as the transmissive member has a thickness of 5.5 mm (5 mm from the light incident surface to the dimming surface and 0.5 mm from the dimming surface to the light exit surface).

A dimming pattern is formed in the dimming surface of the surface-emitting unit according to each of Examples 1 to 5 with the use of a white ink (having a transmittance of 47.5%, a reflectance of 47.5%, and an absorptance of 5%).

Figure 13:
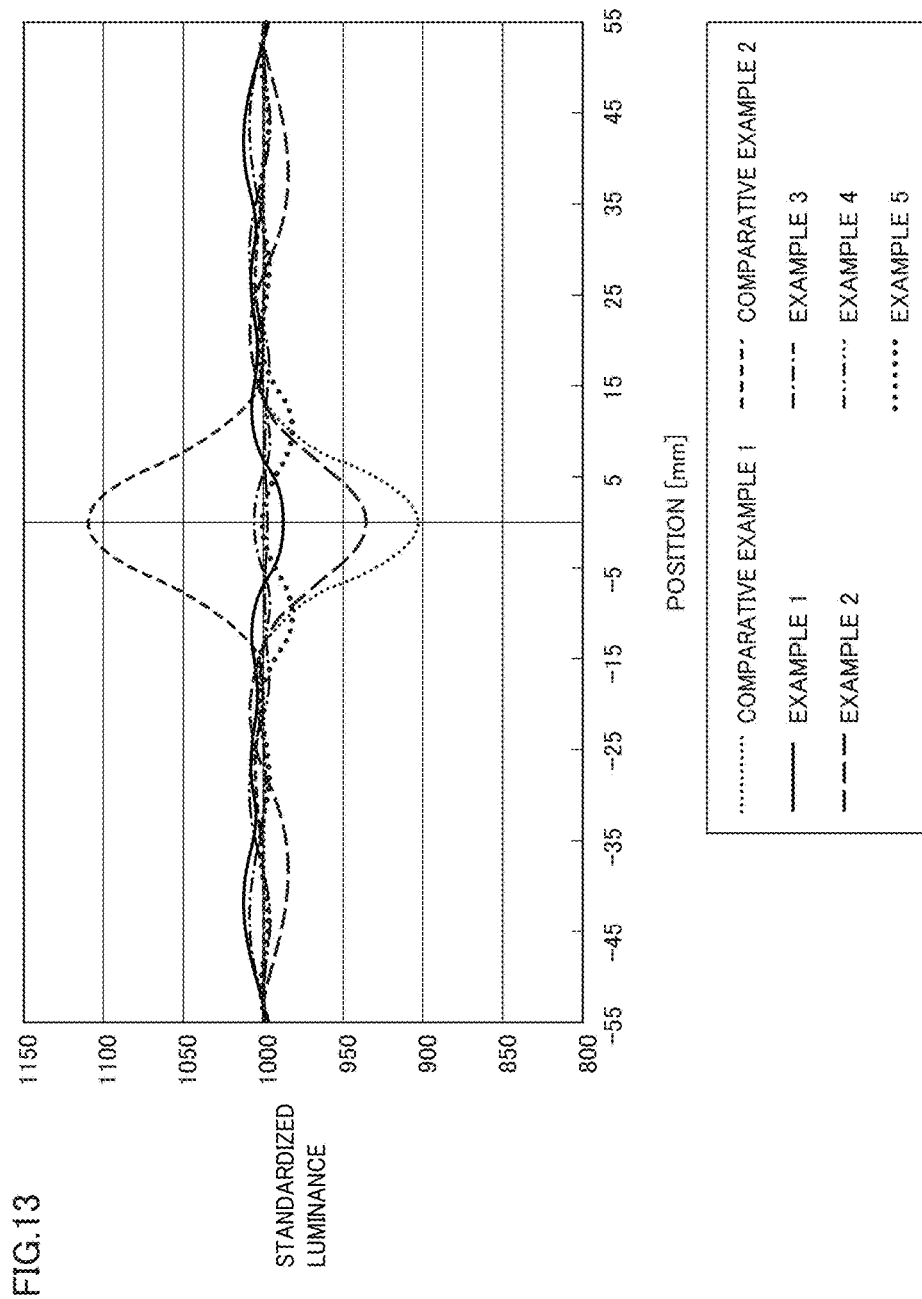
FIG. 13 is a graph showing a standardized front luminance profile of surface-emitting units according to Examples 1 to 5 and Comparative Examples 1 to 2.

FIG. 13 is a graph showing standardized front luminance profiles of the surface-emitting units according to Examples 1 to 5 and Comparative Examples 1 to 2. Positions (mm) on the abscissa shown in FIG. 13 show that 0 mm represents the center of the non-light-emitting portion produced between two juxtaposed surface-emitting panels, ±5 mm represents positions where the non-light-emitting portion is present, and ±50 mm represents the substantial center of the surface-emitting panel. The standardized front luminance is standardized such that the center of the surface-emitting panel (the center of the light-emitting region) is defined to have a value of 1000.

Figure 14:
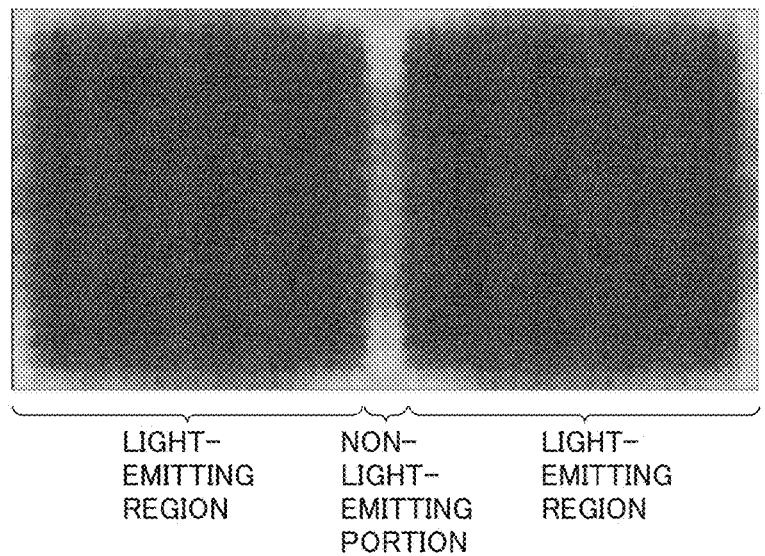
FIG. 14 is a conceptual, partially enlarged view showing a distribution of a density of dimming patterns in Example 1.
Figure 15:
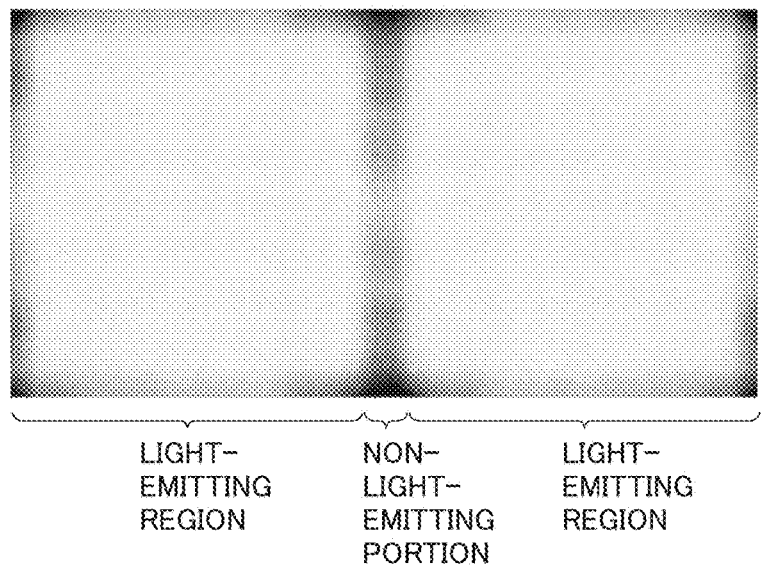
FIG. 15 is a conceptual, partially enlarged view showing a distribution of a density of dimming patterns in Example 2.
Figure 16:
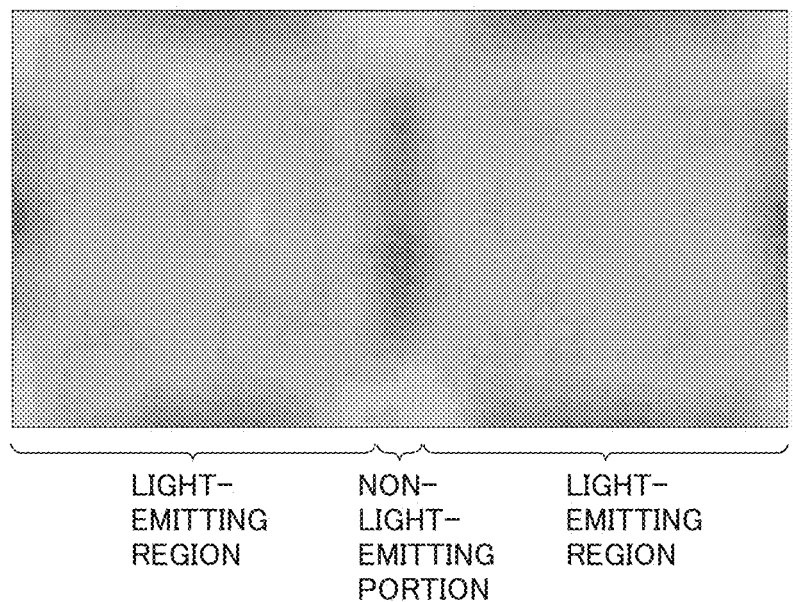
FIG. 16 is a conceptual, partially enlarged view showing a distribution of a density of dimming patterns in Example 3.
Figure 17:
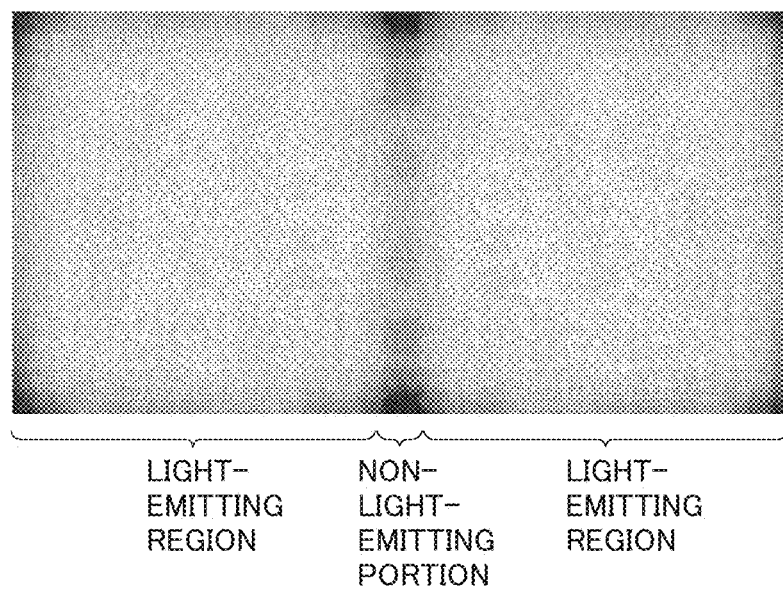
FIG. 17 is a conceptual, partially enlarged view showing a distribution of a density of dimming patterns in Example 4.
Figure 18:
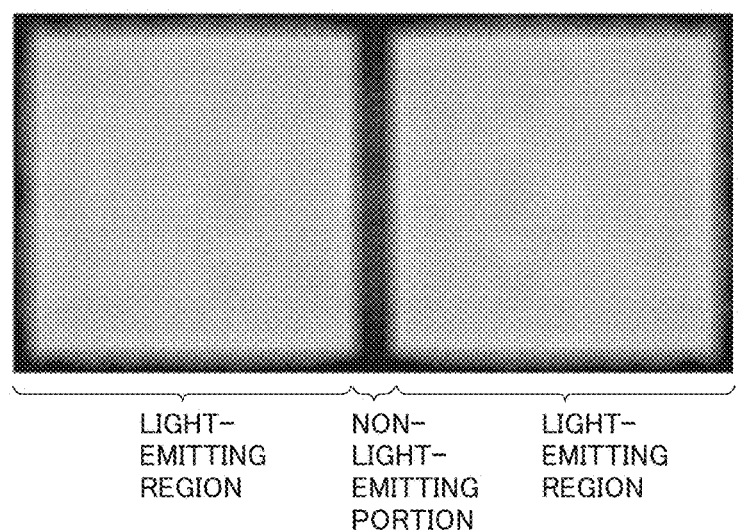
FIG. 18 is a conceptual, partially enlarged view showing a distribution of a density of dimming patterns in Example 5.

FIG. 14 is a conceptual, partially enlarged view showing a distribution of a density of dimming patterns in Example 1. FIG. 15 is a conceptual, partially enlarged view showing a distribution of a density of dimming patterns in Example 2. FIG. 16 is a conceptual, partially enlarged view showing a distribution of a density of dimming patterns in Example 3. FIG. 17 is a conceptual, partially enlarged view showing a distribution of a density of dimming patterns in Example 4. FIG. 18 is a conceptual, partially enlarged view showing a distribution of a density of dimming patterns in Example 5. Annular dimming regions in FIGS. 14, 16, and 17 each have a diameter of 0.3 mm. Annular dimming regions in FIGS. 15 and 18 have diameters varied from 0.25 mm to 0.5 mm. In the distributions of the density shown in FIGS. 14 to 18, a black portion represents a portion where a dimming region is present, and a deeper black portion represents a higher density of dimming regions.

Description will initially be given with Comparative Example 1 including the surface-emitting panel provided with the organic EL element according to the first configuration example being compared with Examples 1 and 2.

It can be confirmed with reference to FIG. 13 that a standardized front luminance at the light-emitting surface of a surface-emitting unit according to Comparative Example 1 is lower in a region corresponding to the non-light-emitting portion produced between two juxtaposed surface-emitting panels.

It can be seen that the surface-emitting units according to Examples 1 and 2 are higher in standardized front luminance in a region corresponding to the non-light-emitting portion and more uniform in front luminance distribution than the surface-emitting unit according to Comparative Example 1.

As shown in FIG. 14, it can be seen that, in the surface-emitting unit according to Example 1, in its surface, a density of annular dimming patterns is lower in a region facing the non-light-emitting portion than in the region facing the light-emitting region. Namely, the dimming surface has a such a distribution of light transmittance in its surface that a transmittance is higher in a region facing the non-light-emitting region than in a region facing the light-emitting region.

Since the surface-emitting unit according to Example 1 is less in difference in luminance between the non-light-emitting region and the light-emitting region with the distribution of light transmittance above, it is generally more uniform in front luminance distribution than the surface-emitting unit according to Comparative Example 1.

It can be seen as shown in FIG. 15 that, in the surface-emitting unit according to Example 2, in its surface, a region facing the non-light-emitting portion is higher in density of annular dimming patterns than the region facing the light-emitting region. Namely, the dimming surface has such a distribution of light transmittance in its surface that the region facing the non-light-emitting region is lower in transmittance than the region facing the light-emitting region.

In the surface-emitting unit according to Example 2, with the dimming surface being provided, light which reaches the dimming surface tends to be diverted and to pass toward the front (pass as being scattered). Light scattered and reflected by the reflection member provided to face the non-light-emitting portion tends to reach the portion of the dimming surface which faces the non-light-emitting portion. The light which reaches that portion tends to pass toward the front, and hence a luminance in the region corresponding to the non-light-emitting portion is improved as compared with the surface-emitting unit according to Comparative Example 1.

Therefore, the surface-emitting unit according to Example 2 is less in difference in luminance between the non-lightemitting portion and the light-emitting region even though it has the distribution of light transmittance above. The surface-emitting unit according to Example 2 generally achieves a more uniform front luminance distribution than the surface-emitting unit according to Comparative Example 1, although uniformity is not as high as in the surface-emitting unit according to Example 1.

Description will now be given with Comparative Example 2 including the surface-emitting panel provided with the organic EL element according to the second configuration example being compared with Examples 3 and 4.

It can be confirmed with reference to FIG. 13 again that the standardized front luminance of the light-emitting surface of the surface-emitting unit according to Comparative Example 2 is improved in the region corresponding to the non-light-emitting portion produced between two juxtaposed surface-emitting panels. Unlike Comparative Example 1, Comparative Example 2 achieves an improved luminance in the region corresponding to the non-light-emitting portion. This is because, in the organic EL element according to the second configuration example, the light distribution curve shown in FIG. 8 includes the portion satisfying the condition of L>cos θ and hence a quantity of light which exits toward the front as being scattered and reflected by the reflection member provided to face the non-light-emitting portion is large.

It can be seen that the surface-emitting units according to Examples 3 and 4 is lower in standardized front luminance and more uniform in front luminance distribution than the surface-emitting unit according to Comparative Example 2, in a region corresponding to the non-light-emitting portion.

As shown in FIG. 16, it can be seen that, in the surface-emitting unit according to Example 3, in its surface, a density of annular dimming patterns is higher in a region facing the non-light-emitting portion than in the region facing the light-emitting region. Namely, the dimming surface has a such a distribution of light transmittance in its surface that a transmittance is lower in a region facing the non-light-emitting region than in a region facing the light-emitting region.

Since the surface-emitting unit according to Example 3 is less in difference in luminance between the non-light-emitting portion and the light-emitting region with the distribution of light transmittance above, it is generally more uniform in front luminance distribution than the surface-emitting unit according to Comparative Example 2.

It can be seen as shown in FIG. 17 that, in the surface-emitting unit according to Example 4, in its surface, a region facing the non-light-emitting portion is higher in density of annular dimming patterns than the region facing the light-emitting region. Namely, the dimming surface has such a distribution of light transmittance in its surface that the region facing the non-light-emitting portion is lower in transmittance than the region facing the light-emitting region. In the distribution of dimming patterns in Example 4, a density of dimming patterns is relatively high also in the region facing the light-emitting region, and a distribution of transmittance balanced in accordance with the front luminance distribution of the surface-emitting panel is achieved.

Since the surface-emitting unit according to Example 4 is less in difference in luminance between the non-light-emitting portion and the light-emitting region with the distribution of light transmittance above, it is generally more uniform in front luminance distribution than the surface-emitting unit according to Comparative Example 2.

Description will now be given with Comparative Example 2 including the surface-emitting panel provided with the organic EL element according to the second configuration example being compared with Example 5.

It can be seen with reference to FIG. 13 again that the surface-emitting unit according to Example 5 is lower in standardized front luminance and more uniform in front luminance distribution than the surface-emitting unit according to Comparative Example 2 in the region corresponding to the non-light-emitting portion.

It can be seen as shown in FIG. 18 that, in the dimming pattern in Example 5 (a black portion in FIG. 18), the region facing the non-light-emitting portion is higher in density of annular dimming patterns than the region facing the light-emitting region in its surface. Namely, the dimming surface has such a distribution of light transmittance in its surface that the region facing the non-light-emitting portion is lower in transmittance than the region facing the light-emitting region. In the distribution of dimming patterns in Example 5, a density of dimming patterns is relatively high also in the region facing the light-emitting region, and a distribution of transmittance balanced in accordance with the front luminance distribution of the surface-emitting panel is achieved.

Since the surface-emitting unit according to Example 5 is less in difference in luminance between the non-light-emitting portion and the light-emitting region with the distribution of light transmittance above, it is generally more uniform in front luminance distribution than the surface-emitting unit according to Comparative Example 2.

The surface-emitting unit without a reflection member according to Example 5 and the surface-emitting unit with a reflection member according to Comparative Example 2 were compared with each other. A surface-emitting unit obtained by removing a reflection member from the surface-emitting unit according to Comparative Example 2, however, is high in standardized front luminance in the region corresponding to the non-light-emitting portion. Therefore, the surface-emitting unit according to Example 5 is generally more uniform in front luminance distribution.

From the foregoing, basically, when a surface-emitting panel has, in its surface, such a distribution of luminance of a light source that a front luminance of a peripheral portion is higher than a front luminance of a central portion of a light-emitting region, a luminance of the region facing the non-light-emitting portion tends to be improved. Therefore, a more uniform front luminance distribution can be realized by configuring the dimming surface such that a region facing the light-emitting region has a distribution of light transmittance higher in transmittance than a region facing the non-light-emitting portion (or the non-light-emitting region) in its surface.

When a surface-emitting panel has, in its surface, such a distribution of luminance of a light source that a front luminance of a peripheral portion is lower than a front luminance of a central portion of a light-emitting region, improvement in luminance of the region facing the non-light-emitting portion is less likely. Therefore, a more uniform front luminance distribution can be realized by configuring the dimming surface such that a region facing the light-emitting region has a distribution of light transmittance lower in transmittance than a region facing the non-light-emitting portion (or the non-light-emitting region) in its surface.

As is understood also from the results of simulation, generally, such a front luminance distribution that a luminance in the front direction of a portion corresponding to a non-light-emitting portion and a periphery thereof is improved is obtained with the configuration of the surface-emitting unit in the embodiments described above. Consequently, it was confirmed that a surface-emitting unit in which non-uniformity in luminance was lessened and the non-light-emitting portion was more inconspicuous was obtained.

In each embodiment described above, though a case that an integrated reflection member in a cross shape is arranged in a gap formed between adjacent surface-emitting panels so as to adapt to the shape of the gap has been exemplified and described, the reflection member may be formed from such four reflection members that sites each extending in a form of a rod are independently formed.

In each embodiment described above, though a case that the non-light-emitting portion and the reflection member are substantially equal to each other in width has been exemplified and described, the widths do not necessarily have to be equal to each other, and any one may be greater than the other.

In each embodiment described above, though a case that desired light distribution characteristics are obtained by adjusting a thickness of the electron transfer layer of the organic EL element has been exemplified, a method of obtaining desired light distribution characteristics is not limited thereto, and for example, another method such as modifying a film configuration of an organic EL element can naturally be applied. When a surface-emitting panel including a light source other than an organic EL element is employed as the surface-emitting panel as well, desired light distribution characteristics as described above can be obtained by various adjusting a configuration of the light source.

In each embodiment described above, though a case that the present invention is applied to a surface-emitting unit including four surface-emitting panels in array has been exemplified and described, the number or a layout of surface-emitting panels is not limited as such, and the present invention is applicable also to a surface-emitting unit in any configuration in which two or more surface-emitting panels are provided and the surface-emitting panels are disposed as being two-dimensionally adjacently disposed.

The surface-emitting unit to which the present embodiment is applied is not limited to lighting apparatuses in a narrow sense, which are used in applications of indoor and outdoor lighting, and the surface-emitting unit to which the present invention is applied includes lighting apparatuses in a broad sense, which are provided, for example, in a display, a display device, or a signboard or an advertisement of an electronic display type.

A surface-emitting unit described above includes a plurality of surface-emitting panels which are disposed such that light-emitting surfaces are two-dimensionally aligned and emit light toward a front, a transmissive member which is arranged to face the light-emitting surfaces of adjacent surface-emitting panels, propagates light emitted from the surface-emitting panels as being reflected in the transmissive member, and can allow light to exit from a light exit surface, and a scattering member which is provided to face the light exit surface of the transmissive member and scatters the light emitted from the plurality of surface-emitting panels.

The transmissive member has a light incident surface on which light emitted from the surface-emitting panels is incident, and further has a dimming surface provided between the light incident surface and the light exit surface. The light-emitting surface of each of the plurality of surface-emitting panels has a light-emitting region which emits light and a non-light-emitting region which is located around an outer periphery of the light-emitting region and does not emit light. The dimming surface is configured such that a region facing the non-light-emitting region is different in transmittance of light from a region facing the light-emitting region, in accordance with a distribution of light emitted from each of the plurality of surface-emitting panels.

Preferably, the surface-emitting unit further includes a light scattering portion which scatters light propagated by the transmissive member toward the front. The light scattering portion is provided in a portion of the transmissive member which faces the light-emitting surface and formed from a reflection member which scatters and reflects some of light propagated by the transmissive member toward the front.

Preferably, the dimming surface has a plurality of annular dimming regions which decrease a quantity of light which will pass through the dimming surface. Each dimming region has a radius not greater than a width from the dimming surface to the light exit surface.

Preferably, a color of light emitted from the plurality of surface-emitting panels, a color of the dimming region, and a color of the scattering member are the same.

Preferably, the surface-emitting panel and the transmissive member are formed of a flexible material.

By adopting the configuration described above, non-uniformity in luminance can be lessened.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1, 1A surface-emitting unit; 10A, 10B, 10C, 10D surface-emitting panel; 11A, 11B, 11C, 11D transparent substrate; 12A, 12B, 12C, 12D light-emitter; 13A, 13B, 13C, 13D light-emitting surface; 14A, 14B, 14C, 14D light-emitting region; 15A, 15B, 15C, 15D non-light-emitting region; 16 transmissive member; 17 dimming surface; 18 scattering sheet; 20 reflection member; 21 light incident surface; 22 light exit surface; 30 gap; 40 non-light-emitting portion; 110 transparent electrode layer; 120 organic electroluminescent layer; 121 light-emitting layer; 122 hole transfer layer; 123 electron transfer layer; and 130 reflection electrode layer.

The invention claimed is:
1. A surface-emitting unit comprising:
a plurality of surface-emitting panels which are disposed such that light-emitting surfaces are two-dimensionally aligned and emit light toward a front side;
a transmissive member which is arranged to face the light-emitting surfaces of adjacent surface-emitting panels, propagates light emitted from the surface-emitting panels as being reflected in the transmissive member, and can allow light to exit from a light exit surface; and
a scattering member which is provided to face the light exit surface of the transmissive member and scatters the light emitted from the plurality of surface-emitting panels,
the transmissive member having a dimming surface provided between a light incident surface on which light emitted from the surface-emitting panels is incident and the light exit surface,
the light-emitting surface of each of the plurality of surface-emitting panels having a light-emitting region which emits light and a non-light-emitting region which is located around an outer periphery of the light-emitting region and does not emit light, and the dimming surface being configured such that a region facing the non-light-emitting region is different in transmittance of light from a region facing the light-emitting region so as to lessen non-uniformity in a front luminance distribution of the light-emitting surfaces generated by a distribution of light emitted from each of the plurality of surface-emitting panels.

2. The surface-emitting unit according to claim 1, the surface-emitting unit further comprising a light scattering portion which scatters light propagated by the transmissive member toward the front side, wherein the light scattering portion is provided in a portion of the transmissive member which faces the light-emitting surface and formed from a reflection member which scatters and reflects some of light propagated by the transmissive member toward the front side.

3. The surface-emitting unit according to claim 1, wherein the dimming surface has a plurality of annular dimming regions which decrease a quantity of light which will pass through the dimming surface, and each dimming region has a radius not greater than a width from the dimming surface to the light exit surface.

4. The surface-emitting unit according to claim 3, wherein a color of light emitted from the plurality of surface-emitting panels, a color of the dimming region, and a color of the scattering member are identical to one another.

5. The surface-emitting unit according to claim 1, wherein the surface-emitting panel and the transmissive member are formed of a flexible material.

* * * * *